(12) United States Patent
Mv et al.

(10) Patent No.: US 11,956,923 B2
(45) Date of Patent: Apr. 9, 2024

(54) POWER DEVICE AND COOLING PLATE

(71) Applicant: THERMO KING LLC, Minneapolis, MN (US)

(72) Inventors: Subrahmanya Mv, Shimoga (IN); Harikrishnan Nayanar K, Kannur (IN); Alexander Iglizn, Erkrath (DE); Irfan Abdul Majeed, Bantwal (IN)

(73) Assignee: THERMO KING LLC, Minneapolis, MN (US)

( * ) Notice: Subject to any disclaimer, the term of this patent is extended or adjusted under 35 U.S.C. 154(b) by 0 days.

(21) Appl. No.: 17/824,099

(22) Filed: May 25, 2022

(65) Prior Publication Data

US 2022/0386507 A1 Dec. 1, 2022

(30) Foreign Application Priority Data

May 25, 2021 (IN) .............................. 202111023203
Jul. 27, 2021 (EP) ..................................... 21187949

(51) Int. Cl.
*H05K 7/20* (2006.01)
*H02B 1/56* (2006.01)

(52) U.S. Cl.
CPC .......... *H05K 7/20272* (2013.01); *H02B 1/56* (2013.01); *H05K 7/20927* (2013.01); *H05K 7/20945* (2013.01)

(58) Field of Classification Search
CPC .......... H05K 7/20272; H05K 7/20927; H05K 7/20945; H02B 1/56
See application file for complete search history.

(56) References Cited

U.S. PATENT DOCUMENTS 6,439,300 B1 * 8/2002 Falta ...................... F25D 21/14
165/152
6,740,853 B1 * 5/2004 Johnson .................. C23C 16/46
219/443.1
(Continued)

FOREIGN PATENT DOCUMENTS

CN 109473409 3/2019
EP 2533281 12/2012
(Continued)

OTHER PUBLICATIONS

Extended European Search Report, issued in the corresponding EP patent application No. 22175414.6, dated Sep. 27, 2022, 13 pages.
(Continued)

*Primary Examiner* — Mukundbhai G Patel
(74) *Attorney, Agent, or Firm* — HSML P.C.

(57) ABSTRACT

According to a first aspect there is disclosed an assembly comprising a power device and a cooling plate which overlies the power device for heat transfer therebetween. The power device comprises a plurality of power switching components including at least a first power switching component and a second power switching component; wherein each of the power switching components is configured to dissipate heat to the cooling plate. The cooling plate comprises a plurality of cooling zones overlying and aligned with the respective power switching components for heat transfer, including first and second cooling zones corresponding to the first and second power switching components; and a flow channel for a cooling flow, extending between an inlet and an outlet through each of the cooling zones; wherein a geometric parameter of the flow channel that at least partly determines heat transfer in a respective cooling zone differs between the first and second cooling zones for improved heat transfer in the first cooling zone relative to the second cooling zone. According to a second (Continued)

aspect, there is disclosed a method for cooling the plurality of power switching components in an assembly in accordance with the first aspect.

18 Claims, 8 Drawing Sheets

(56) References Cited

U.S. PATENT DOCUMENTS

| | | |
|---|---|---|
| 2010/0172091 A1 | 7/2010 | Nishiura |
| 2013/0343105 A1* | 12/2013 | Kosugi ............... B60L 15/2009 363/56.01 |
| 2014/0140117 A1 | 5/2014 | Ishibashi |
| 2015/0146376 A1 | 5/2015 | Taguchi |
| 2018/0168075 A1* | 6/2018 | Okazaki ............ H05K 7/20927 |
| 2020/0137930 A1 | 4/2020 | Bruckner et al. |

FOREIGN PATENT DOCUMENTS

| | | |
|---|---|---|
| EP | 3758059 | 12/2020 |
| JP | 2003-324173 | 11/2003 |
| JP | 2008-205087 | 9/2008 |
| JP | 2012-146759 | 8/2012 |
| WO | 2012/152551 | 11/2012 |

OTHER PUBLICATIONS

Extended European Search Report, issued in the corresponding EP patent application No. 21187949.9, dated Jan. 21, 2022, 13 pages.

* cited by examiner

FIG. 1A  FIG. 1B

POWER DEVICE AND COOLING PLATE

FIELD OF THE INVENTION

The invention relates to an assembly comprising a power device and a cooling plate for use as part of an electrical power switching system, in particular although not exclusively an electrical power switching system configured to invert a direct electrical current input from a battery into an alternating electrical current supply for a transport refrigeration system (TRU). During operation, the power device generates heat which is removed by the cooling plate.

BACKGROUND OF THE INVENTION

It is known for a transport refrigeration unit (TRU) to comprise at least one component which requires an alternating electrical current supply. A TRU may also be powered by a direct current electrical supply, such as a battery. An electrical power switching system, such as an inverter, may be incorporated into a TRU to invert a direct current electrical supply into an alternating current electrical supply. An electrical power switching system may comprise at least one electrical power switching component, such as an IGBT, a MOSFET, a transformer and/or a thyristor.

During operation, heat generated within an electrical power switching system may cause a temperature of the electrical power switching system to increase. If the temperature of the electrical power switching system is excessively high, components of the electrical power switching system may be damaged.

It is therefore desirable to remove heat from an electrical power switching system during operation.

It is known to use passive cooling systems for this purpose. Such systems may rely on natural convective cooling to remove heat from an electrical power switching system. It is also known to use active cooling systems for this purpose. Such systems may incorporate pumps and/or fans configured to effect forced convective cooling to remove heat from an electrical power switching system.

SUMMARY

According to a first aspect there is disclosed an assembly comprising a power device and a cooling plate which overlies the power device for heat transfer therebetween,
the power device comprising:
  a plurality of power switching components including at least a first power switching component and a second power switching component; wherein each of the power switching components is configured to dissipate heat to the cooling plate;
the cooling plate comprising:
  a plurality of cooling zones overlying and aligned with the respective power switching components for heat transfer, including first and second cooling zones corresponding to the first and second power switching components; and
  a flow channel for a cooling flow, extending between an inlet and an outlet through each of the cooling zones;
wherein a geometric parameter of the flow channel that at least partly determines heat transfer in a respective cooling zone differs between the first and second cooling zones for improved heat transfer in the first cooling zone relative to the second cooling zone.

An average heat transfer coefficient for a cooling zone may be defined as an area weighted average of a heat transfer coefficient, where the area is the wetted area of the flow channel within the respective cooling zone.

A geometric parameter of the flow channel which differs between the first and second cooling zones may be a hydraulic diameter of the flow channel.

It may be that a relatively smaller hydraulic diameter tends to result in a greater heat transfer coefficient.

It may also be that the flow channel has a local length direction coincident with a centroid of the channel between the inlet and the outlet, a height extending away from the power device, and a width locally orthogonal to the local length direction and height; and wherein a geometric parameter of the flow channel which differs between the first and second cooling zones is the width of the flow channel, the width of the flow channel in the second cooling zone being larger than the width of the flow channel in the first cooling zone.

A relatively narrower width may tend to result in a greater heat transfer coefficient, particularly when a height of the flow channel is substantially constant.

It may be that the flow channel has a local length direction coincident with a centroid of the channel between the inlet and the outlet, and a height extending away from the power device; and wherein a geometric parameter of the flow channel which differs between the first and second cooling zones is the height of the flow channel, the height of the flow channel in the second cooling zone being greater than the height of the flow channel in the first cooling zone.

It may be that a relatively smaller height tends to result in a greater heat transfer coefficient, particularly when a width of the flow channel is substantially constant.

It may also be that a geometric parameter of the flow channel which differs between the first and second cooling zones is a cross-sectional area of the flow channel, the flow channel having a smaller cross-sectional area in the second cooling zone than a cross-sectional area of the flow channel in the first cooling zone.

The cross-sectional area of the flow channel may be the cross-sectional area at a point along the flow channel. The cross-sectional area in each cooling zone for the purpose of the comparison may be the smallest cross-sectional area in the respective cooling zone. Where a cooling zone has multiple passes of the flow channel, the cross-sectional area of the flow channel is not to be determined as a total cross-sectional area of the respective passes.

It may be that a geometric parameter of the flow channel which differs between the first and second cooling zones is a number of passes of the flow channel that extend through the respective cooling zone, with there being fewer passes in the second cooling zone than in the first cooling zone.

It may be that a geometric parameter of the flow channel which differs between the first and second cooling zones is a characteristic dimension of a flow acceleration protrusion extending into the flow channel and configured to locally accelerate the cooling flow by locally reducing the cross-sectional area of the flow channel; the characteristic dimension being zero when in the absence of a flow acceleration protrusion; wherein a characteristic dimension of a flow acceleration protrusion in the first cooling zone is non-zero and greater than a characteristic dimension of a flow acceleration protrusion in the second cooling zone.

The characteristic dimension of the flow acceleration protrusion may differ between the first cooling zone 142 and the second cooling zone 144 by at least 3% of an average width of the flow channel in the respective cooling zone, at least 10% of an average width of the flow channel in the respective cooling zone or at least 15% of an average width of the flow channel in the respective cooling zone.

It may be that the characteristic dimension of the flow acceleration protrusion differs between the first cooling zone 142 and the second cooling zone 144 by at least 3% of an average width of a respective pass of the flow channel 150 in the cooling zone, at least 10% of an average width of a respective pass of the flow channel 150 in the cooling zone or at least 15% of an average width of a respective pass of the flow channel 150 in the cooling zone.

In the first cooling zone, there may be a flow acceleration protrusion extending into the flow channel configured to locally accelerate the cooling flow by locally reducing the hydraulic diameter, wherein the flow acceleration protrusion is aligned with a geometrical centre of the first power switching component.

The or each flow acceleration protrusion may be fastened to or configured to fasten to a respective power switching component.

The or each flow acceleration protrusion may be within a central region of the respective cooling zone which overlies and is aligned with the respective power switching component.

The flow acceleration protrusion in the first cooling zone may be aligned with a geometrical centre of the first cooling zone. It may be that each flow acceleration protrusion associated with a respective cooling zone is aligned with a geometrical centre of the respective cooling zone and/or respective power switching component.

It may be that wherein the flow acceleration protrusion bifurcates the flow channel to provide two branches within the respective cooling zone, the branches bifurcating and re-joining within the respective cooling zone.

It may be that at least one geometric parameter differs between the first and second cooling zones selected from the group consisting of:
  a hydraulic diameter of the flow channel;
  a width or height of the flow channel;
  a cross-sectional area of the flow channel;
  a number of passes of the flow channel through the respective cooling zone; and
  a characteristic dimension of a flow acceleration protrusion configured to locally accelerate the cooling flow.

The power device may be configured to operate in a first operation mode in which a heat generation rate of the first power switching component is greater than a heat generation rate of the second power switching component.

It may be that the power device is configured to operate in a first operation mode in which both the first and second switching components generate heat, and such that: the peak or average heat transfer coefficient is greater in the first cooling zone is greater than in the second cooling zone; a heat transfer rate between the power device and the cooling plate is greater in the first cooling zone than in the second cooling zone.

The assembly according to the first aspect may further comprise: a pump configured to provide a cooling flow to the flow channel in use; a sensor configured to monitor a temperature of the first power switching component; and a controller configured to control an operation of the pump based on an output of the sensor to maintain a temperature of the first power switching component within a target temperature range.

It may be that there are at least three power switching components each having a respective cooling zone of the cooling plate, such that there are at least three pairs of cooling zones, wherein for each pair of cooling zones, at least one geometric parameter differs between the respective cooling zones for improved heat transfer.

The at least one geometric parameter which differs between respective cooling zones of each pair of cooling zones may be selected from the group consisting of: a hydraulic diameter of the flow channel; a width or height of the flow channel; a cross-sectional area of the flow channel; a number of passes of the flow channel through the respective cooling zone; and a characteristic dimension of a flow acceleration protrusion configured to locally accelerate the cooling flow.

It may be that the geometric parameter which differs is configured to provide a greater peak or average heat transfer coefficient in the first cooling zone than in the second cooling zone.

It may be that the average heat transfer rate coefficient is integrated over a wetted area of the flow channel within the cooling zone.

It may be that in each cooling zone, the flow channel has a normalised wetted area defined as a ratio of a wetted area of the flow channel within the cooling zone to an area of the power switching component overlying the cooling zone; and the geometric parameter which differs is configured to provide a greater normalised wetted area in the first cooling zone than in the second cooling zone It may be that in the first operation mode, each cooling zone has a normalised heat transfer rate corresponding to a ratio of a local heat transfer rate between the cooling plate and a cooling flow to a temperature difference therebetween; and the geometric parameter which differs such that there is a greater normalised heat transfer rate in the first cooling zone than in the second cooling zone.

It may be that the normalised heat transfer rate is integrated over the area of the respective power switching component overlying the cooling zone.

According to a second aspect, there is disclosed a method for cooling the plurality of power switching components in an assembly in accordance with the first aspect, the method comprising:
  operating the power device so that at least some of the power switching components including the first and second power switching components generate heat;
  providing a cooling flow to the flow channel using a pump;
  cooling the first power switching component by providing the cooling flow to the first cooling zone for heat exchange with the first power switching device; and
  cooling the second power switching component by providing the cooling flow to the second cooling zone for heat exchange with the second power switching component;
  wherein a heat transfer rate from the power device to the cooling plate is greater in the first cooling zone than in the second cooling zone.

The method according to the second aspect may further comprise: monitoring a temperature of the first power switching device using a temperature sensor; controlling an operation of the pump based on a signal from the temperature sensor to maintain a temperature of the first power switching component within a target range.

BRIEF DESCRIPTION OF THE DRAWINGS

FIG. 1A shows a front view of an example assembly comprising a power device and a cooling plate, wherein the cooling plate comprises a flow channel;

FIG. 1B shows a rear view of the example assembly shown in FIG. 1A;

DETAILED DESCRIPTION

Figure 1C:
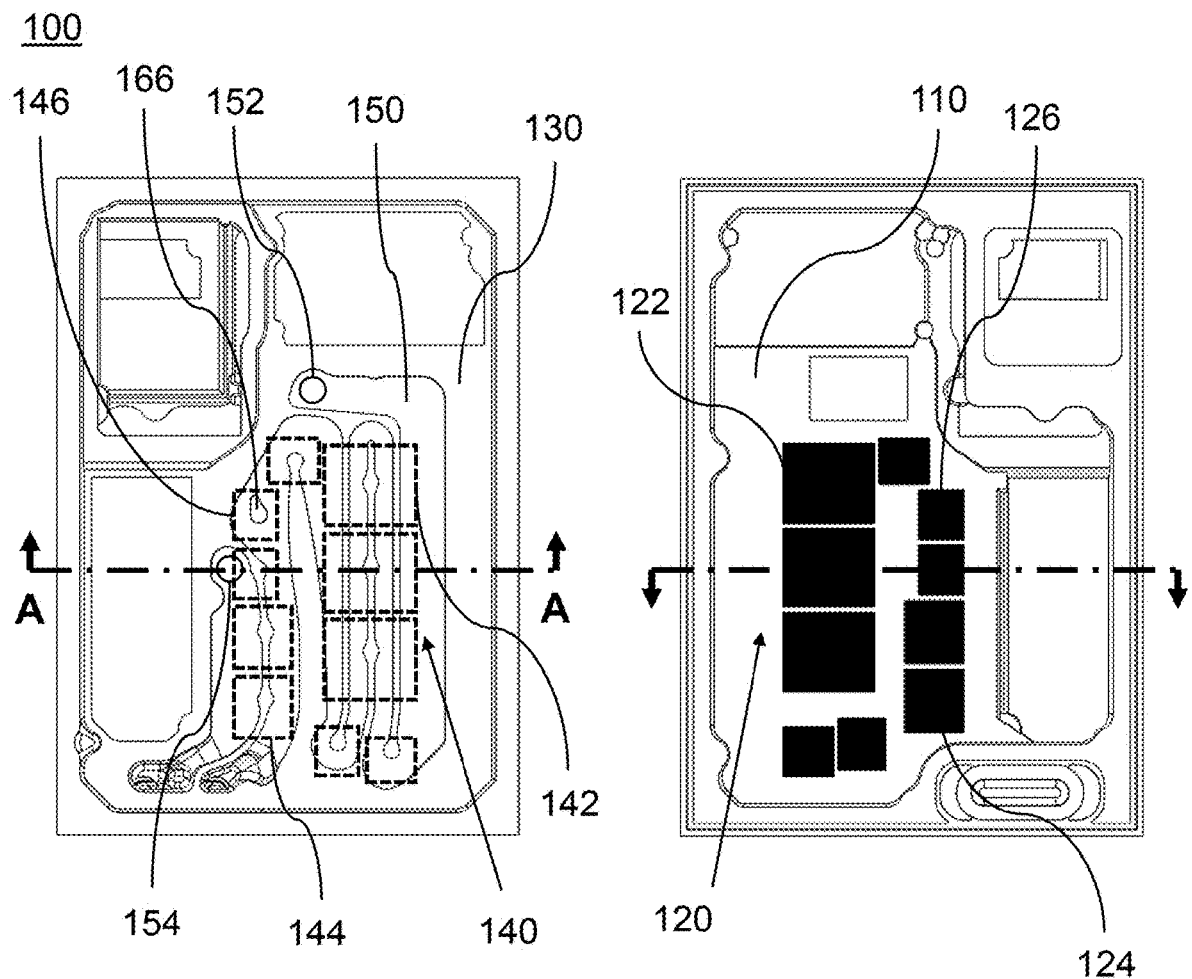
FIG. 1C shows a cross-sectional view of the example assembly shown in FIG. 1A at section A-A.
Figure 1C:
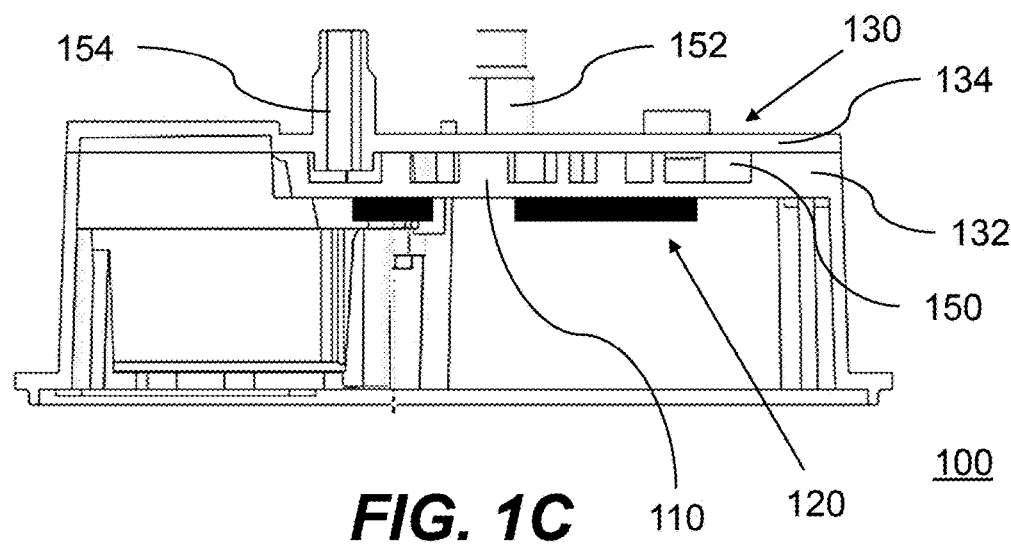

FIGS. 1A-1C each show an example assembly 100 comprising a power device 110 and a cooling plate 130. FIG. 1A shows a front view of the example assembly comprising a power device 110 and a cooling plate 130. FIG. 1B shows a rear view of the example assembly 100 shown in FIG. 1A. FIG. 1C shows a cross-sectional view of the example assembly 100 shown in FIG. 1A at section A-A.

The power device 110 comprises a plurality of power switching components 120. Each power switching component may comprise, for example, an insulated gate bipolar transistor (IGBT), a thyristor, a transformer, and/or a metal-oxide-semiconductor field-effect transistor (MOSFET). The plurality of power switching components 120 includes a first power switching component 122 and a second power switching component 124.

As shown in FIGS. 1A-1C, the assembly 100 comprises a generally layered structure in which the plurality of power switching components 120 are provided in a layer and the cooling plate 130 is provided to overly the power switching components 120. Within the cooling plate 130 there is a flow channel 150 as will be described in further detail below. In the example of FIGS. 1A-1C, the cooling plate is provided in a two-layer structure including a body 132 in which the flow channel 150 is defined in the form of a groove and a closure 134 which closes the flow channel 150, as will be described in further detail below.

One or more of the plurality of power switching components 120 may be configured to receive a direct current (DC) electrical supply from a shared DC source, such as a battery or a DC shore power connection (e.g. a local grid connection). Alternatively or additionally, one or more of the plurality of power switching components 120 may be configured to receive a DC electrical supply from a respective DC source. One or more of the plurality of power switching components 120 may be configured to receive an alternating current (AC) electrical supply from a respective AC source, such as a generator or an AC shore power connection. One or more of the plurality of power switching components 120 may be configured to provide an AC electrical supply to a respective electrical load.

Each power switching component is configured to dissipate heat to the cooling plate 130 in use. Heat dissipation from each power switching component to the cooling plate 130 is generally to a corresponding local region of the cooling plate in a proximity of the power switching component. The corresponding local area of the cooling plate functions as a cooling zone, wherein heat is transferred from the corresponding power switching component to the cooling plate 130.

The cooling plate 130 comprises a plurality of cooling zones 140, wherein each cooling zone overlies and is aligned with a respective power switching component for heat transfer. For the purposes of the present disclosure, a cooling zone of the cooling plate 130 is defined as a region directly overlying a respective power switching component, along an axis normal to a plane defined by an interface between the respective power switching component and the cooling plate 130. The plurality of cooling zones 140 includes a first cooling zone 142 and a second cooling zone 144 corresponding to the first power switching component and the second power switching component, respectively. As mentioned above, the cooling plate 130 comprises a flow channel 150 extending between an inlet 152 and an outlet 154 through each cooling zone. In use, the flow channel 150 is provided with a cooling flow. The cooling flow may comprise, for example, a flow of water or a flow of other process fluid (e.g. a coolant). In use, the cooling flow is provided to each cooling zone through the flow channel 150 for heat exchange with each power switching component.

Each of the plurality of power switching components 120 is operated only when the respective electrical load is required to operate. Accordingly, any combination of the plurality of power switching components 120 may be operated at a given point in time. When operated, the respective power switching components 120 generate heat. A heat generation rate of each power switching component is dependent on a power requirement of the respective electrical load and a power switching efficiency of the power switching component.

A heat transfer rate and heat flux between each power switching component and the cooling plate in each cooling zone corresponds to (i.e. is approximately proportional to and may be approximate to) a heat transfer rate and heat flux between the cooling plate and the cooling flow in the respective cooling zone. The latter is dependent on a local temperature difference between the cooling plate and the fluid and a local heat transfer coefficient over a wetted area of the flow channel 150 in the respective cooling zone—i.e. the area that bounds the cooling channel. The local temperature difference and the local heat transfer coefficient may vary over the wetted area and throughout the cooling zone, such that the local heat flux varies over the wetted area and throughout the cooling zone.

If the heat generation rate of one of the plurality of power switching components 120 exceeds the heat transfer rate in the corresponding cooling zone (i.e. to the cooling plate), then a temperature of the power switching component will increase. This increase may continue until the temperature difference between the power switching component and the cooling fluid (which influences the temperature of the cooling plate) is large enough to place the power switching component in a thermodynamic equilibrium with the cooling flow in the corresponding cooling zone.

Heat dissipation from a power switching component therefore tends to rise in accordance with heat transfer coefficient between the cooling flow and the cooling plate and tends to rise in accordance with the wetted area of the interface between the cooling flow and the cooling plate.

A total heat transfer rate of the assembly 100 may be approximated as a sum of the heat transfer rate within each of the respective cooling zones. The total heat transfer rate is a function of a mass flow rate of the cooling flow and the local heat transfer conditions along the flow channel, including the local temperature difference between the cooling plate and the cooling flow (influenced by the temperature difference between the respective power switching component and the cooling flow), the local heat transfer coefficient, and the wetted area of the flow channel.

In a previously considered configuration, a cooling plate may be provided with a flow channel configured with a substantially uniform geometric profile such that, in use, the local heat transfer coefficient and the wetted area in each cooling zone associated with a power switching component is approximately constant. In such an arrangement, the heat transfer rate at each power switching component may primarily be a function of the temperature difference between the respective power switching components and the working fluid. In such arrangements, power switching components having a relatively high rate of heat generation would therefore tend to become relatively hotter in order to dissipate heat.

Consequently, in such previously considered arrangements, it may be that a first cooling zone transfers insufficient heat from a respective power switching component to maintain its temperature within a target temperature range. At the same time, with such previously considered arrangements it may be that a second cooling zone generating relatively less heat remains at temperature far below a limit temperature, such that it may be considered that there is unnecessary heat transfer away from the respective power switching component, which could potentially be beneficially distributed to other power cooling zones.

Such previously considered arrangements may therefore operate relatively inefficiently, potentially with a relatively high mass flow rate (and thereby operating power) being required in order to maintain the hottest power switching component within an acceptable temperature range, even if this results in excessive cooling of other components.

In the configuration shown in FIGS. 1A-1C, the cooling plate 130 is provided with a flow channel 150 in which one or more geometric parameters vary between cooling zones to promote local heat transfer (i.e. to locally increase the heat transfer coefficient) to varying degrees and/or to vary the wetted area from one cooling zone to another. Heat transfer coefficients within the cooling zones, and the wetted area in each cooling zone may depend on one or more geometrical parameters, as will be discussed in further detail below.

One or more geometric parameters may differ from one cooling zone to another, in particular one or more geometric parameters selected from the group consisting of: a hydraulic diameter of the flow channel 150; a width or height of the flow channel 150; a cross-sectional area of the flow channel 150; a number of passes of the flow channel through the corresponding cooling zone 150; and a characteristic dimension of a flow acceleration protrusion configured to locally accelerate the cooling flow.

For example, at least one geometrical parameter of the flow channel 150 differs between the first cooling zone 142 and second cooling zone 144 for improved heat transfer in the first cooling zone 142 relative to the second cooling zone 144. Herein, discussion of geometric parameters differing to provide "improved heat transfer" relates to locally increasing the heat transfer coefficient at the walls of the flow channel, such that the expression "improved heat transfer" is independent of the temperature difference (i.e. between the cooling plate and the cooling fluid in the flow channel). In other words, the geometric parameter which differs between the zones has a greater effect in promoting heat transfer in the first cooling zone 142 than in the second cooling zone 144.

When the first cooling zone 142 is associated with a power switching component (a first power switching component) which generates comparatively more heat than a power switching component associated with the second cooling zone 144 (a second power switching component), varying the geometric parameter for improved heat transfer in the first cooling zone (independent of the temperature difference) effectively biases a relatively larger proportion of the total heat transfer rate of the assembly to the first cooling zone, and may therefore help to limit the temperature of the power switching component without transferring an unnecessarily large amount of heat from the second power switching component.

The following description relates to variations of the above geometrical parameters discussed above with reference to FIGS. 1A-1C, the effects of which will be discussed with reference to FIG. 2A, FIGS. 3A-3B and FIGS. 4A-4B which show contour plots of local flow velocity; local heat transfer coefficient; and local heat flux, respectively, as seen from various views of the example assembly 100 shown in FIG. 1A in use.

Without wishing to be bound by theory, the local heat transfer coefficient between the cooling plate 130 and the cooling flow is generally a function of, among other things, a hydraulic diameter of the flow channel 150 and a speed of the cooling flow. For example, the Dittus-Boelter equation provides a relationship between the hydraulic diameter of a flow channel and the speed of the cooling flow, along with other factors such as a thermal conductivity of the cooling flow and a viscosity of the cooling flow. The local heat transfer coefficient of the cooling flow will generally increase as the speed of the cooling flow increases, whereas the local heat transfer coefficient will generally increase as the hydraulic diameter of the flow channel 150 decreases.

The hydraulic diameter of the flow channel 150 is a characteristic dimension of the flow channel 150. The hydraulic diameter is related to a ratio of a cross-sectional area of the flow channel 150 and a wetted perimeter thereof. If the flow channel 150 has a circular cross-section, the hydraulic diameter is equal to the diameter of the circular cross section. However, if the flow channel 150 has a polygonal cross section, the hydraulic diameter may be varied without changing the cross-sectional area by altering the wetted perimeter. Likewise, the cross-sectional area of the flow channel 150 may be varied without changing the hydraulic diameter thereof by altering the wetted perimeter.

The geometric parameter which differs between the first cooling zone 142 and the second cooling zone 144 may be the hydraulic diameter of the flow channel. The hydraulic diameter of the flow channel 150 in the first cooling zone 142 may be smaller than the hydraulic diameter of the flow channel 150 in the second cooling zone 144. The relatively small hydraulic diameter of the flow channel 150 in the first cooling zone 142 tends to result in a greater peak or average local heat transfer coefficient within the first cooling zone 142 compared to the peak or average local heat transfer coefficient in the second cooling zone 144.

The geometric parameter which differs between the first cooling zone 142 and the second cooling zone 144 may be the cross-sectional area of the flow channel 150. In practical operating conditions, the cooling flow is incompressible (e.g. it may be a liquid flowing at a speed of less than 0.3 Ma and thereby considered incompressible). Therefore, a conservation of mass principle requires that the cooling flow will accelerate when the cross-sectional area of the flow channel 150 decreases. The cross-sectional area of the flow channel 150 in the first cooling zone 142 may be smaller than the cross-sectional area of the flow channel 150 in the second cooling zone 144, such that the speed of the cooling flow is greater in the first cooling zone 142, and the peak or average local heat transfer coefficient in the first cooling zone 142 is greater than the peak or average local heat transfer coefficient in the second cooling zone 144.

Figure 2A:
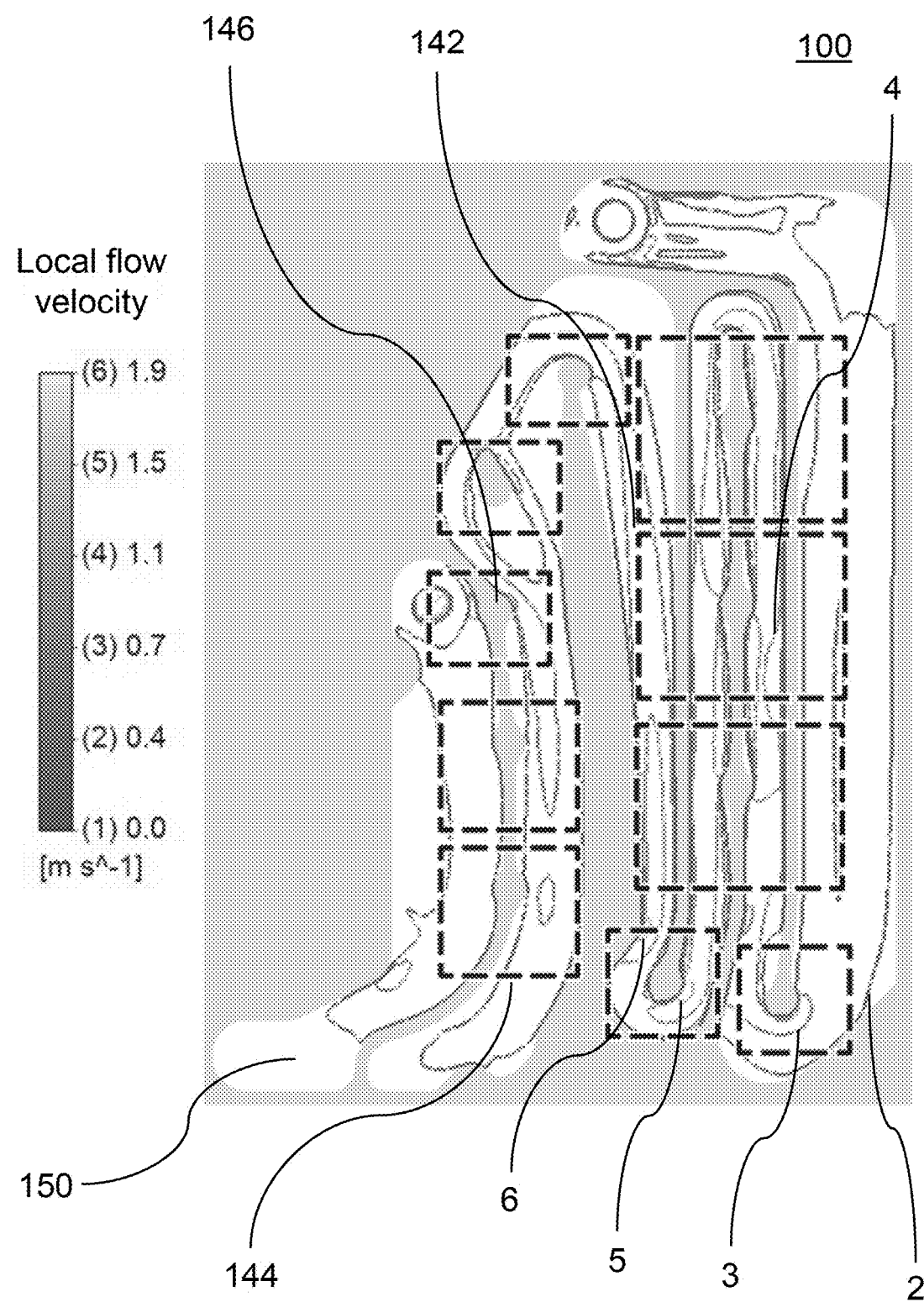
FIG. 2A shows a contour plot corresponding to local flow velocity throughout the flow channel of the example assembly shown in FIG. 1A, as seen from a front view in use.

FIG. 2A shows a contour plot corresponding to local flow velocity throughout the flow channel 150 of the example assembly 100 shown in FIG. 1A, as seen from a front view in use. Reference numerals 1 to 6 are used to demarcate contours corresponding to the values shown on the legend. The cross-sectional area of the flow channel 150 in the first cooling zone 142 is smaller than the cross-sectional area of the flow channel in the second cooling zone 144. The local flow velocity is greater in the first cooling zone 142 than in the second cooling zone 144.

Figure 3A:
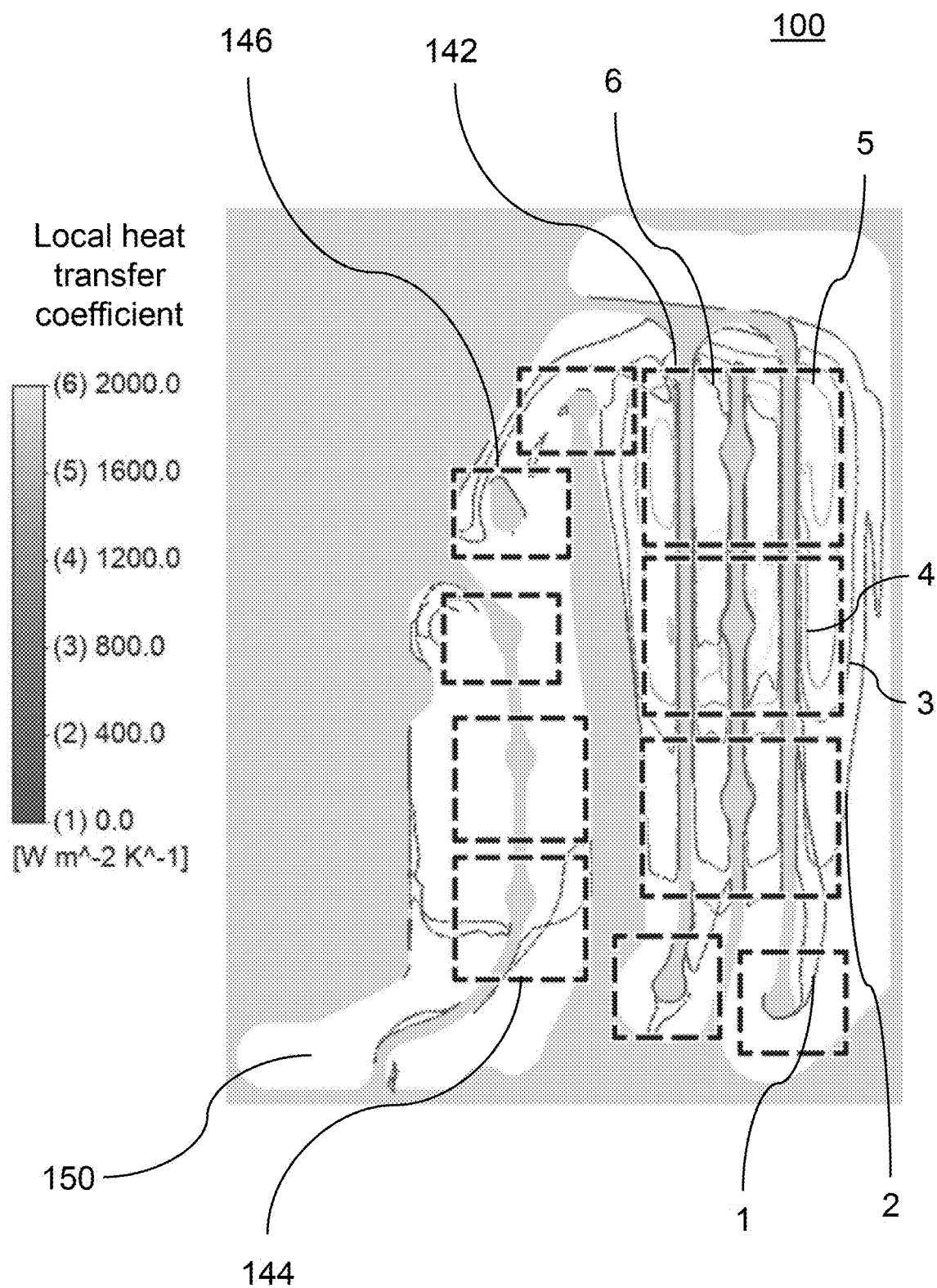
FIG. 3A shows a contour plot corresponding to local heat transfer coefficient throughout the flow channel of the example assembly shown in FIG. 1A, as seen from a front view in use.

FIG. 3A shows a contour plot corresponding to local heat transfer coefficient throughout the flow channel 150 of the example assembly 100 shown in FIG. 1A, as seen from a front view in use. Reference numerals 1 to 6 are used to demarcate contours corresponding to the values shown on the legend. The flow channel 150 can be considered to have a base surface which is proximal to the power switching devices and a top surface which is distal to the power switching devices (and in this example defined by the closure). Owing to limitations of the post-processing software generating the contour plots, contours on both the base surface and the top surface are shown.

Nevertheless, the heat transfer coefficient is generally significantly higher on the base surface owing to the proximity of the power switching devices, and it has been determined that groups of successive contours indicating sustained rises in heat transfer coefficient correspond to the heat transfer coefficient at the base rather than the top surface. As can be seen from FIG. 3A, the peak local heat transfer coefficient in the first cooling zone 142 is greater than the peak local heat transfer coefficient in the second cooling zone 144, with the peak local heat transfer coefficient being above contour (6) corresponding to 2000 $Wm^{-2}K^{-1}$ in the first cooling zone 142 and not rising above contour (3) corresponding to 800 $Wm^{-2}K^{-1}$ in the second cooling zone 144. In addition, the average local heat transfer coefficient in the first cooling zone 142 is greater than the average local heat transfer coefficient in the second cooling zone 144.

The flow channel 150 has a local length direction coincident with a tangent of a centroid of the flow channel 150 between the inlet 152 and the outlet 154. The flow channel 150 also has a height extending away from the power device 110. In addition, the flow channel 150 has a width locally orthogonal to both the local length direction and the height.

The geometric parameter which differs between the first cooling zone 142 and the second cooling zone 144 may be the width of the flow channel 150. The width of the flow channel 150 in the second cooling zone 144 may be larger than the width of the flow channel 150 in the first cooling zone 142. The relative reduction in width of the flow channel 150 in the first cooling zone 142 may result in a reduced hydraulic diameter of the flow channel 150 and/or a reduced cross sectional area in the first cooling zone 142. As explained above, this tends to result in an increased peak or average local heat transfer coefficient within the first cooling zone 142. Accordingly, the relative reduction in width of the flow channel 150 in the first cooling zone 142 leads to improved heat transfer in the first cooling zone 142 relative to the second cooling zone 144 in use.

The geometric parameter which differs between the first cooling zone 142 and the second cooling zone 144 may be the height of the flow channel 150. The height of the flow channel 150 in the second cooling zone 144 may be larger than the height of the flow channel 150 in the first cooling zone 142. The relative reduction in height of the flow channel 150 in the first cooling zone 142 may result in a reduced hydraulic diameter of the flow channel 150 and/or a reduced cross sectional area in the first cooling zone 142. As explained above, this tends to result in an increased peak or average local heat transfer coefficient within the first cooling zone 142. Accordingly, the relative reduction in height of the flow channel 150 in the first cooling zone 142 leads to improved heat transfer in the first cooling zone 142 relative to the second cooling zone 144 in use.

Figure 4A:
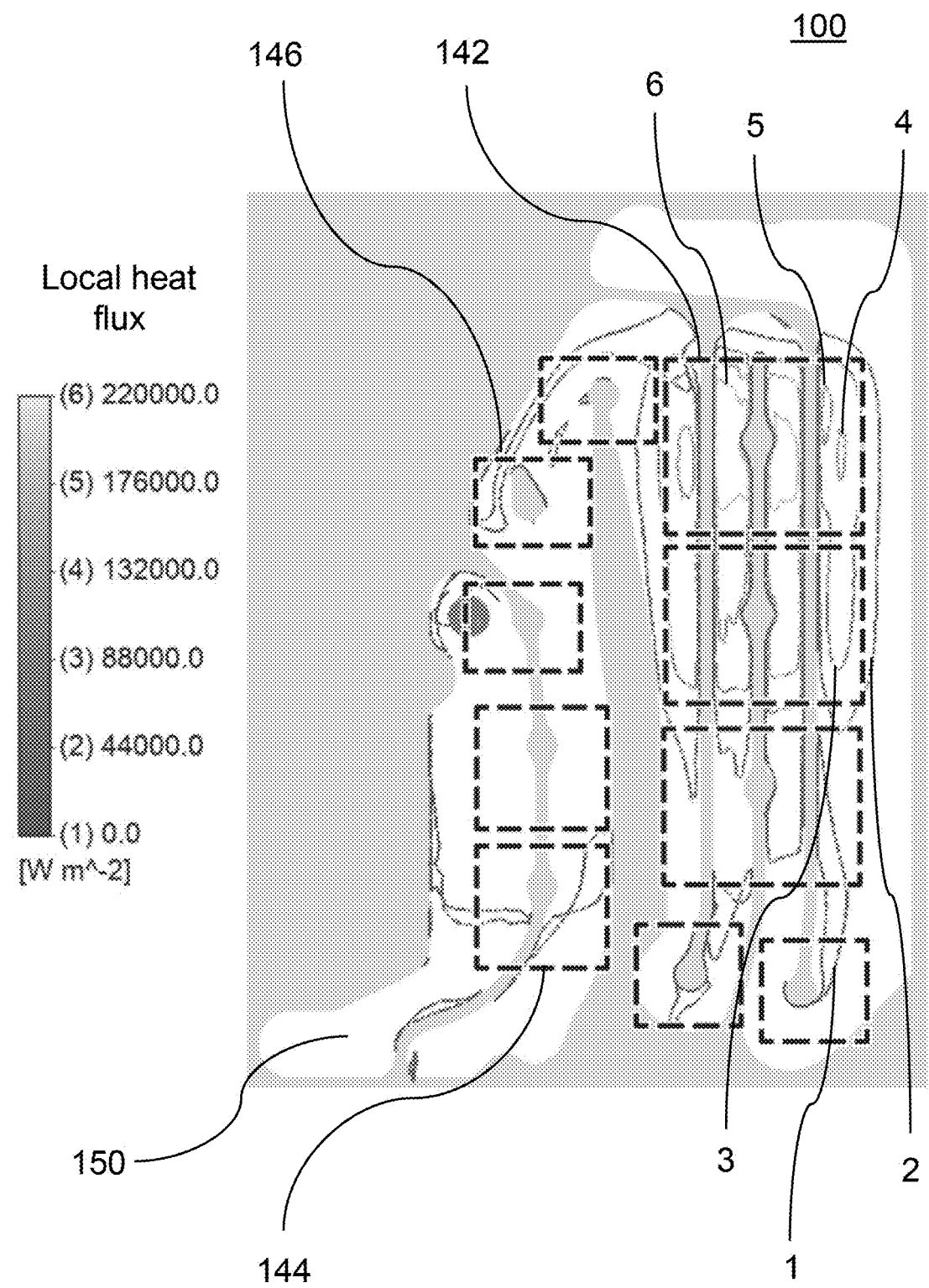
FIG. 4A shows a contour plot of local heat flux throughout the flow channel of the example assembly shown in FIG. 1A, as seen from a front view in use.

FIG. 4A shows a contour plot of local heat flux throughout the flow channel 150 of the example assembly 100 shown in FIG. 1A, as seen from a front view in use. Reference numerals 1 to 6 are used to demarcate contours corresponding to the values shown on the legend. The distribution of local heat flux throughout the flow channel 150 shown in FIG. 4A is related to the distribution of local heat transfer coefficient throughout the flow channel 150 in FIG. 3A, and also related to the temperature difference between the cooling plate 130 and the fluid in the flow channel. It can be seen that the maximum heat flux in the first cooling zone 142 is greater than the maximum heat flux in the second cooling zone 144. In addition, the average heat flux in the first cooling zone 142 is greater than the average heat flux in the second cooling zone 144. Consequently, heat transfer in the first cooling zone 142 is improved relative to heat transfer in the second cooling zone 144.

The geometric parameter which differs between the first cooling zone 142 and the second cooling zone 144 may be a number of passes of the flow channel 150 that extend through the respective cooling zone. In the example assembly 100 of FIGS. 1A-1C, there are fewer passes in the second cooling zone 144 than in the first cooling zone 142. The greater number of passes in the first cooling zone 142 results in a larger wetted area therein, which has the effect of increasing the total amount of heat transfer in the first cooling zone 142 to a greater degree than in the second cooling zone 144. Consequently, there is improved heat transfer in the first cooling zone 142 compared to the second cooling zone 144.

Multiple passes may be provided to enhance a rate of heat transfer in a confined space. Two portions of the flow channel may be considered as passes when they extend substantially side-by-side within a respective cooling zone, for example as separated by a wall of the flow channel (which may be referred to as a septum wall).

It may be that a width of a first septum wall separating two portions of the flow channel in the first region is smaller than a width of a second septum wall separating two portions of the flow channel in the second region.

The geometric parameter which differs between the first cooling zone 142 and the second cooling zone 144 may be a characteristic dimension of a flow acceleration protrusion extending into the flow channel 150 from a wall that delimits the flow channel 150. The flow acceleration protrusion is configured to locally accelerate the cooling flow by locally reducing the cross-sectional area of the flow channel 150. The flow acceleration protrusion may also locally reduce the hydraulic diameter of the flow channel 150. As explained above, this tends to result in an increased peak or average local heat transfer coefficient near the flow acceleration protrusion.

The flow acceleration protrusion may be a protrusion which deviates from a substantially continuous profile of the wall that delimits the flow channel 150 in a direction normal to the substantially continuous profile of the wall toward the centroid of the flow channel 150. In this case, the characteristic dimension of the flow acceleration protrusion is a maximum deviation of the wall that delimits the flow channel 150 in the normal direction.

The characteristic dimension of the flow acceleration protrusion may be expressed as a percentage of the average width of the flow channel 150 within the respective cooling zone or as a percentage of the average width of a respective pass of the flow channel 150 in the cooling zone. For example, in the first cooling zone 142, the characteristic dimension of the flow acceleration protrusion may be 10% of the average width of the flow channel 150 in the first cooling zone 142. In the second cooling zone 144, the characteristic dimension of the flow acceleration protrusion may be 20% of the average width of the flow channel 150 in the second cooling zone 144. In this example, the characteristic dimension of the flow acceleration protrusion differs between the first cooling zone 142 and the second cooling zone 144 by 10% of the average width of the flow channel in the respective cooling zone.

The characteristic dimension of the flow acceleration protrusion may differ between the first cooling zone 142 and the second cooling zone 144 by at least 3% of the average width of the flow channel in the respective cooling zone, at least 10% of the average width of the flow channel in the respective cooling zone or at least 15% of the average width of the flow channel in the respective cooling zone.

The characteristic dimension of the flow acceleration protrusion may differ between the first cooling zone 142 and the second cooling zone 144 by at least 3% of the average width of the respective pass of the flow channel 150 in the cooling zone, at least 10% of the average width of the respective pass of the flow channel 150 in the cooling zone or at least 15% of the average width of the respective pass of the flow channel 150 in the cooling zone.

Figure 3B:
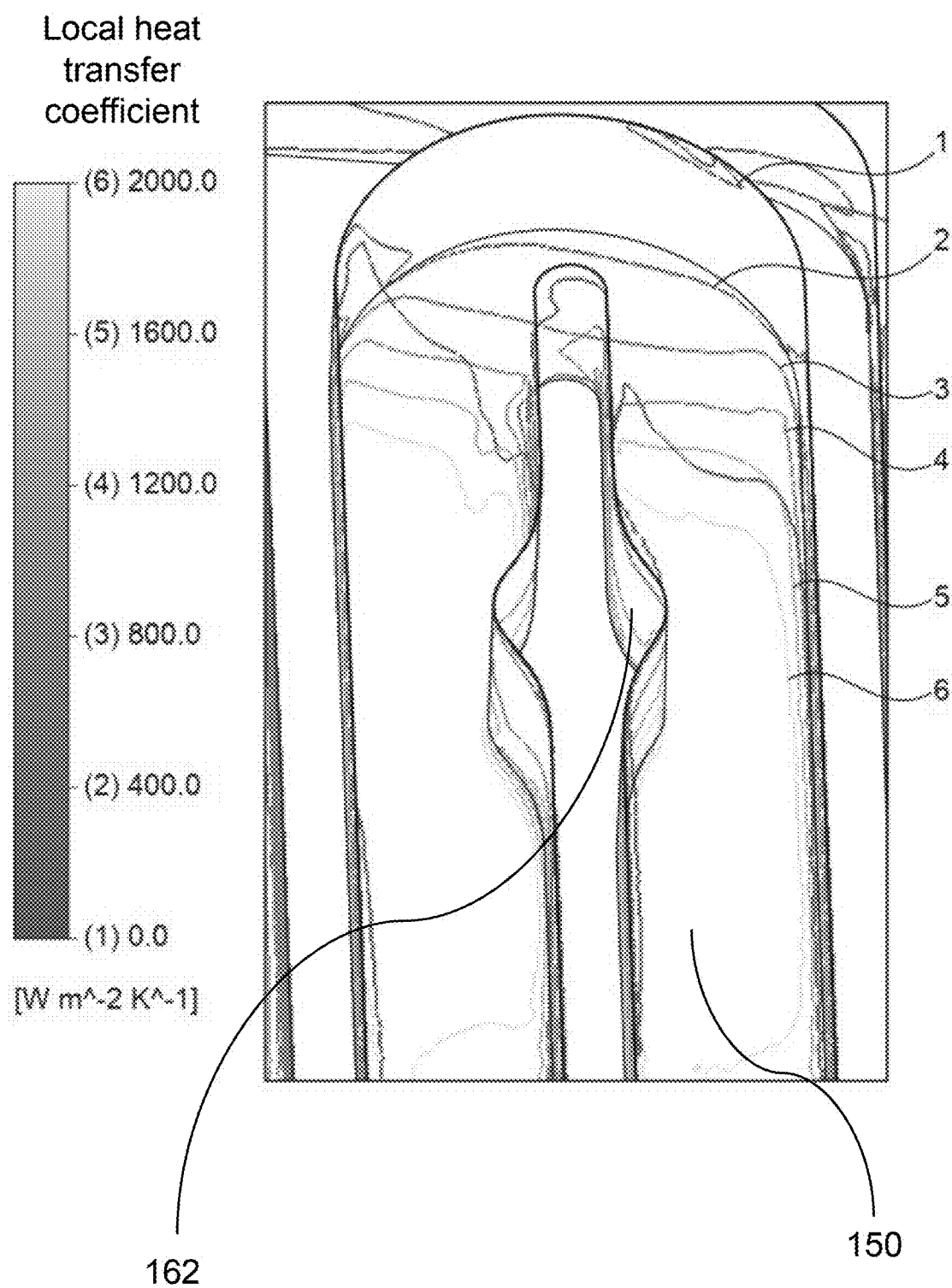
FIG. 3B shows a contour plot corresponding to local heat transfer coefficient within the flow channel shown in FIG. 1A, as seen from a selected perspective view in use.

FIG. 3B shows a contour plot corresponding to local heat transfer coefficient within the flow channel 150 of the assembly 100 shown in FIG. 1A, as seen from a selected perspective view in use. Reference numerals 1 to 6 are used to demarcate contours corresponding to the values shown on the legend. As discussed above, the contours include contours on the top surface of the channel 150, and in the contour plot shown in FIG. 3B there is one contour (2) on the top surface which appears to overlie several other contours that are bunched together on the base surface. The selected view includes a region of the flow channel 150 within the first cooling zone 142 comprising a flow acceleration protrusion 162 having a non-zero characteristic dimension. It can be seen that the local heat transfer coefficient is greatest in a proximity of the flow acceleration protrusion 162.

Figure 4B:
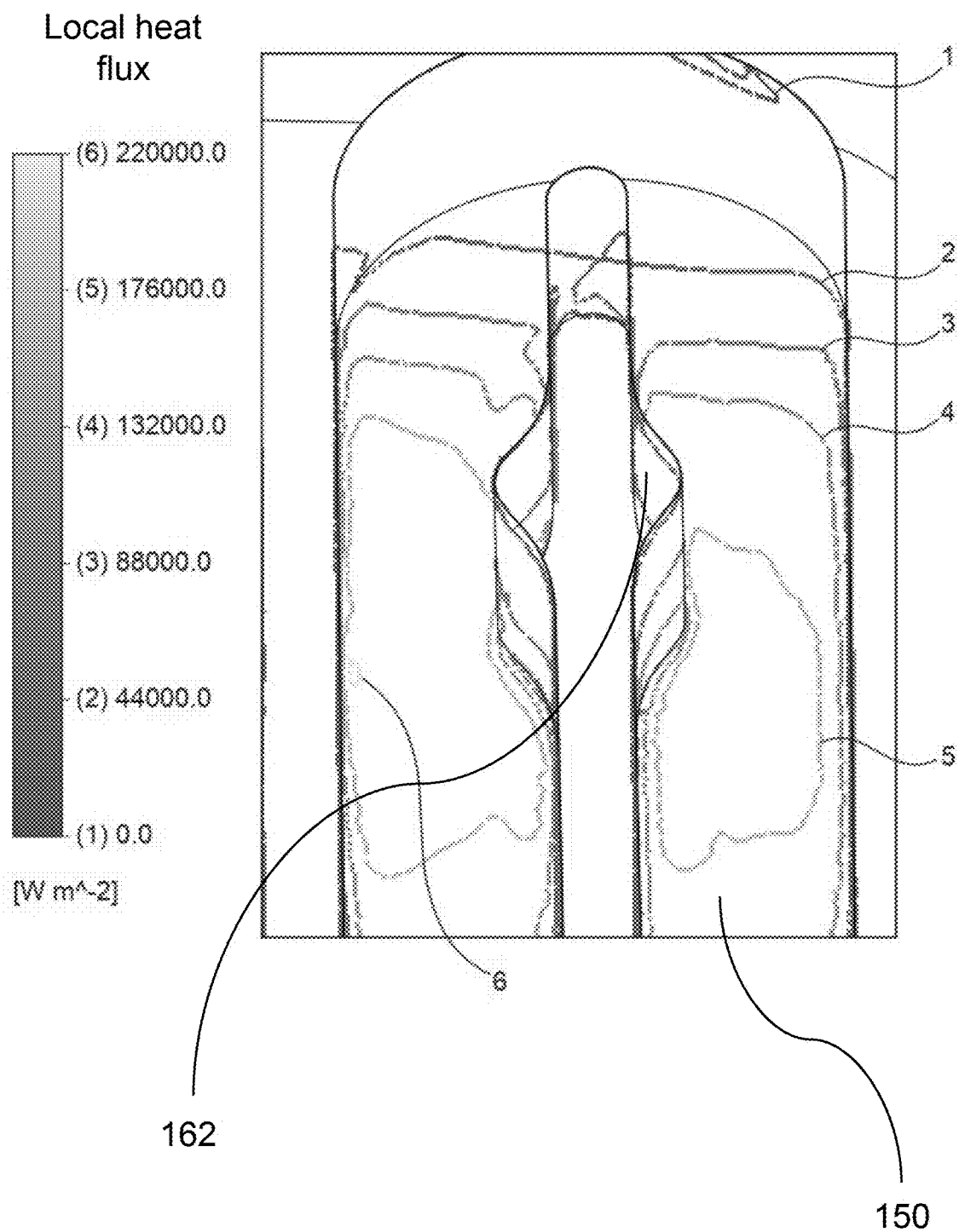
FIG. 4B shows a contour plot of local heat flux within the flow channel of the example assembly shown in FIG. 1A, as seen from a selected perspective view in use.

FIG. 4B shows a contour plot of local heat flux within the flow channel 150 of the example assembly 100 shown in FIG. 1A, as seen from a selected perspective view in use. Reference numerals 1 to 6 are used to demarcate contours corresponding to the values shown on the legend. Like the selected view shown in FIG. 3A, the selected view includes a region of the flow channel 150 within the first cooling zone 142 comprising a flow acceleration protrusion 162 having a non-zero characteristic dimension. It can be seen that local heat flux is greatest in a proximity of the flow acceleration protrusion 162.

In the first cooling zone 142, the flow acceleration protrusion 162 may be aligned with a geometrical centre of the first power switching component 122.

In the first cooling zone 142, the flow acceleration protrusion 162 may be within a central region of the first cooling zone which overlies and is aligned with the respective power switching component. A boundary of each cooling zone may correspond to the boundary of the respective power switching device which the cooling zone overlies and is aligned with. A central region of each cooling zone may be proximal to a geometric centre of the respective power switching component (and/or proximal to a geometric centre of the cooling zone). For example, when a projected area of the cooling zone is defined as the area overlying the respective component, the central region may comprise a circular region of up to 25% of the projected area proximal to the respective geometric centre, or a circular region of up to 50% of the projected area proximal to the respective geometric centre. Any or all flow acceleration protrusions may be within a respective central region of the respective cooling zone. In other variants, any or all flow acceleration protrusion may be within any portion of the respective cooling zone.

The alignment of the geometrical centre of the first power switching component 122 and the flow acceleration protrusion 162 may promote relative uniform dissipation of heat from the first power switching component 120 to the flow acceleration protrusion 162 by conduction, which heat is subsequently convected into the cooling flow in the vicinity of the flow acceleration protrusion 162. Similarly, alignment of the flow acceleration protrusion within the respective central region may promote such relatively uniform dissipation of heat.

It may be that any or each flow acceleration protrusion associated with a respective cooling zone is aligned with a geometrical centre of the respective cooling zone and/or respective power switching component. It may be that any or each flow acceleration protrusion associated with a respective cooling zone is within a central region of the respective cooling zone.

Any or each flow acceleration protrusion may be configured to fasten to a respective power switching component (for example by way of a mechanical fastener). As an example, the or each flow acceleration protrusion may be provided with an internal thread. The internal thread facilitates a simple attachment of the power switching component to the cooling plate and an alignment of the geometrical centre of the power switching component to the respective cooling zone (or alignment of the power switching component so that the flow acceleration protrusion is in the central region of the cooling zone) by cooperation of an inserted screw and the internal thread. Other mechanical fasteners are envisaged. For example, the or each flow acceleration protrusion may be provided with a recess configured to receive a locating projection (e.g. lug) of the power switching component. The flow acceleration protrusion may therefore ensure proper alignment of the geometrical centre of the power switching component and the respective cooling zone (or alignment of the power switching component so that the flow acceleration protrusion is in the central region of the cooling zone), as well as facilitating a simple attachment of the power switching component to the cooling plate.

In use, the cooling flow develops a local speed distribution along the width of the flow channel 150. The local speed distribution may define a higher local speed of the cooling flow at one location along a width of the flow channel 150 and a lower local speed of the cooling flow at another location along the width of the flow channel 150. It may be that the local speed of the cooling flow along the width of the flow channel 150 varies significantly according to the local speed distribution. Accordingly, a distribution of the local heat transfer coefficient and therefore a distribution of the local heat flux may vary significantly along the width of the flow channel 150 as the local speed varies.

A flow acceleration protrusion of any of the plurality of cooling zones 140 may bifurcate the flow channel to provide two branches within the respective cooling zone. If so, the flow acceleration protrusion functions as a bifurcating flow acceleration protrusion.

For illustration only, in the example of FIGS. 1A-1C a bifurcating flow acceleration protrusion 166 is provided in a third cooling zone 146. Nevertheless, it will be understood that any of the plurality of cooling zones 140 may comprise a bifurcating flow acceleration protrusion. The branches may bifurcate and re-join within the respective cooling zone, as shown in the third cooling zone 146. In this case, the bifurcating flow acceleration protrusion 166 may function to cause the local speed distribution of the cooling flow downstream of the bifurcating flow acceleration protrusion 166 to be more uniform that the local speed distribution of the cooling flow upstream of the bifurcating flow acceleration protrusion 166. This effect is clearly shown in FIG. 2A, where the local flow velocity contours downstream of the third cooling zone 146 are more evenly distributed than those upstream of the third cooling zone 146.

It follows that the distribution of the local heat transfer coefficient and the distribution of the local heat flux along the width of the flow channel 150 downstream of the bifurcating flow acceleration protrusion 166 is more uniform than the same upstream of the bifurcating flow acceleration protrusion 166. This effect is shown on FIGS. 3A and 4A, respectively.

Accordingly, the bifurcation and subsequent re-joining of the flow channel 150 provided by the bifurcating flow acceleration protrusion 166 ensures that the distribution of local heat flux downstream of the bifurcating flow acceleration protrusion 166 is more uniform than if the bifurcating flow acceleration protrusion 166 were not present. In turn, this provides more uniform cooling to a power switching device downstream of the bifurcating flow acceleration protrusion 166, which may provide more effective cooling to the downstream power switching device. Consequently, the bifurcating flow acceleration protrusion 166 provides improved heat transfer downstream of the power switching device overlying the cooling zone which contains the bifurcating flow acceleration protrusion.

The power device 110 may be configured to operate in a first operation mode in which a heat generation rate of the first power switching component 122 is greater than a heat generation rate of the second power switching component 124. In the first operation mode, the first power switching component 122 may be configured to provide an electrical power to a first electrical load having a higher power requirement than a second electrical load, to which the second power switching component is configured to provide an electrical power. The first electrical load may be, for example, a generator module of a transport refrigeration unit (TRU), whilst the second electrical load may be, for example, a fan of a TRU.

In the first operation mode, a heat transfer rate between the power device 110 and the cooling plate 130 is greater in the first cooling zone 142 than in the second cooling zone 144.

The variation of the geometric parameter which differs between the first cooling zone 144 and the second cooling zone 142 may be such that there is a greater peak or average heat transfer coefficient in the first cooling zone 142 than in the second cooling zone 144. This has the effect of promoting heat transfer in the first cooling zone 142 to a greater degree than in the second cooling zone 144.

In each cooling zone, the flow channel 150 has a normalised wetted area defined as a ratio of the wetted area of the flow channel 150 within the cooling zone to an area of the power switching component overlying the respective cooling zone. The geometric parameter which differs between the first cooling zone 142 and the second cooling zone 144 may be such that there is a greater normalised wetted area in the first cooling zone 142 than in the second cooling zone 144. The relatively larger normalised wetted area in the first cooling zone 142 has the effect of increasing the total heat transfer in the first cooling zone to a greater degree than in the second cooling zone 144.

When in the first operation mode, each cooling zone has a normalised heat transfer rate corresponding to a ratio of a local heat transfer rate between the cooling plate within the cooling zone and a cooling flow within the cooling zone to a temperature difference therebetween. The normalised heat transfer rate may be integrated over the wetted area of the flow channel (such that the ratio is evaluated at multiple discrete portions of the wetted area). The geometric parameter which differs between the first cooling zone 142 and the second cooling zone 144 may differ such that there is a greater normalised heat transfer rate in the first cooling zone 142 than in the second cooling zone 144 when in the first operation mode.

The assembly 100 is optionally provided with a controller and sensor equipment to control a flow rate of the cooling flow.

Figure 5:
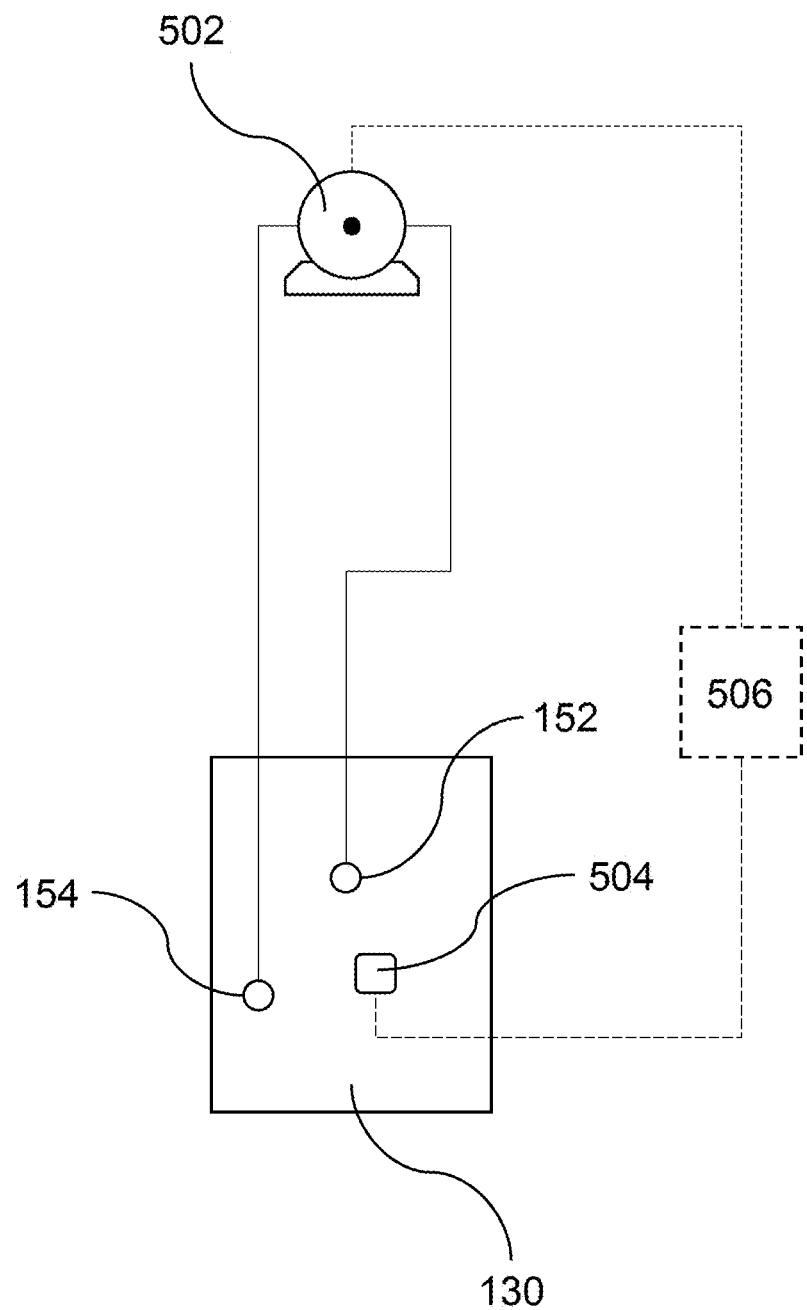
FIG. 5 shows the example assembly shown in FIG. 1A, further comprising a pump, a sensor, and a controller.

FIG. 5 shows the example assembly 100 shown in FIG. 1A, further comprising: a pump 502; a sensor 504; and a controller 506. In use, the pump 502 is configured to provide a cooling flow to the flow channel of the cooling plate via the inlet 152 and outlet 154. A power is provided to the pump 502 to drive the cooling flow along the channel 150.

The sensor 504 is configured to monitor a temperature of the first power switching component. The sensor is also configured to produce an output indicative of the temperature of the first power switching component 122. The sensor 504 may be located proximal to the first power switching component 122, within the first power switching component 122 and/or within the first cooling zone 142. It will be understood that the sensor 504 may be located in any position such that the sensor 504 is able to directly or indirectly monitor the temperature of the first power switching component 122.

The controller 506 is configured to control the pump 502 based on the output of the sensor 504. The controller 506 is configured to control the pump 502 to maintain a temperature of the first power switching component 122 within a target temperature range. This ensures that the power provided to the pump 502 is as low as possible while reducing the risk of thermal damage to the first power switching component 122.

The plurality of power switching components 120 may include a third power switching component 126 overlying a third cooling zone 146. Accordingly, the power device 110 may comprise at least three power switching components each having a respective cooling zone of the cooling plate, such that there are at least three pairs of cooling zones. For each pair of cooling zones, at least one geometric parameter differs between the respective cooling zones for improved heat transfer.

The at least one geometric parameter which differs between respective cooling zones of each pair of cooling zones may be selected from the group consisting of: a hydraulic diameter of the flow channel; a width or height of the flow channel; a cross-sectional area of the flow channel; a number of passes of the flow channel through the respective cooling zone; and a characteristic dimension of a flow acceleration protrusion configured to locally accelerate the cooling flow.

Figure 6:
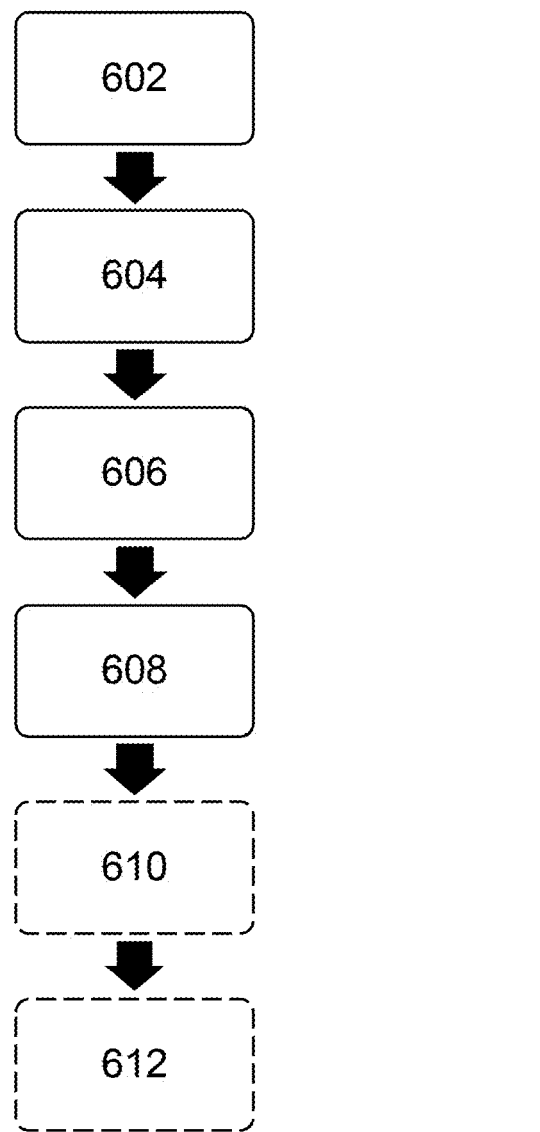
FIG. 6 is a flowchart showing a method for cooling a plurality of power switching components.

FIG. 6 is a flowchart showing a method 600 for cooling a plurality of power switching components in an assembly according to any of the previously described examples.

The method commences at block 602, comprising operating the power device so that at least some of the plurality of power switching components generate heat, including both the first power switching component and the second power switching component. For example, the power device may be operated in the first mode as described above.

At block 604, the method comprises providing a cooling flow to the flow channel using a pump. The cooling flow may comprise, for example, a flow of water or a flow of process fluid.

At 606 the first power switching component is cooled by providing the cooling flow to the first cooling zone for heat exchange with the first power switching device. Heat is transferred from the power device to the cooling flow in the first cooling zone at a heat transfer rate.

At block 608, the second power switching component is cooled by providing the cooling flow to the second cooling zone for heat exchange with the second power switching device. Heat is transferred from the power device to the cooling flow in the second cooling zone at a heat transfer rate.

The heat transfer rate from the power device to the cooling flow is greater in the first cooling zone than in the second cooling zone.

Optionally, at block 610, the method comprises monitoring a temperature of the first power switching device using a temperature sensor. The temperature sensor may be, for example, located on or within the first power switching device. Otherwise, the temperature sensor may be located in a proximity of the first power switching device.

The method 600 may further comprise, at block 612, controlling an operation of the pump based on a signal from the temperature sensor to maintain a temperature of the first power switching component within a target range. The target range may be chosen according to a rated temperature operating range of the first power switching component.

The invention claimed is:

1. An assembly comprising a power device and a cooling plate which overlies the power device for heat transfer therebetween;
the power device comprising:
a plurality of power switching components including at least a first power switching component and a second power switching component; wherein each of the power switching components is configured to dissipate heat to the cooling plate;
the cooling plate comprising:
a plurality of cooling zones overlying and aligned with the respective power switching components for heat transfer, including first and second cooling zones corresponding to the first and second power switching components; and
a flow channel for a cooling flow, extending between an inlet and an outlet through each of the cooling zones;
wherein a geometric parameter of the flow channel that at least partly determines heat transfer in a respective cooling zone differs between the first and second cooling zones for improved heat transfer in the first cooling zone relative to the second cooling zone,
wherein in the first cooling zone, there is a flow acceleration protrusion defined by the cooling plate, the flow acceleration protrusion extending into the flow channel configured to locally accelerate the cooling flow by locally reducing the hydraulic diameter, and
wherein the or each flow acceleration protrusion is fastened to or configured to fasten to a respective power switching component, thereby fastening the respective power switching component to the cooling plate.

2. An assembly according to claim 1, wherein a geometric parameter of the flow channel which differs between the first and second cooling zones is a hydraulic diameter of the flow channel.

3. An assembly according to claim 1, wherein the flow channel has a local length direction coincident with a centroid of the channel between the inlet and the outlet, a height extending away from the power device, and a width locally orthogonal to the local length direction and height;
wherein a geometric parameter of the flow channel which differs between the first and second cooling zones is the width of the flow channel, the width of the flow channel in the second cooling zone being larger than the width of the flow channel in the first cooling zone; and/or
wherein a geometric parameter of the flow channel which differs between the first and second cooling zones is the height of the flow channel, the height of the flow channel in the second cooling zone being greater than the height of the flow channel in the first cooling zone.

4. An assembly according to claim 1, wherein a geometric parameter of the flow channel which differs between the first and second cooling zones is a cross-sectional area of the flow channel, the flow channel having a smaller cross-sectional area in the second cooling zone than a cross-sectional area of the flow channel in the first cooling zone.

5. An assembly according to claim 1, wherein a geometric parameter of the flow channel which differs between the first and second cooling zones is a number of passes of the flow channel that extend through the respective cooling zone, with there being fewer passes in the second cooling zone than in the first cooling zone.

6. An assembly according to claim 1, wherein a geometric parameter of the flow channel which differs between the first and second cooling zones is a characteristic dimension of the flow acceleration protrusion extending into the flow channel and configured to locally accelerate the cooling flow by locally reducing the cross-sectional area of the flow channel; the characteristic dimension being zero when in the absence of the flow acceleration protrusion;
wherein a characteristic dimension of the flow acceleration protrusion in the first cooling zone is non-zero and greater than a characteristic dimension of a flow acceleration protrusion in the second cooling zone.

7. An assembly according to claim 6, wherein the or each flow acceleration protrusion is within a central region of the respective cooling zone which overlies and is aligned with the respective power switching component.

8. An assembly according to claim 7, wherein the or each flow acceleration protrusion is aligned with a geometrical centre of the first power switching component.

9. An assembly according to claim 1, wherein the flow acceleration protrusion bifurcates the flow channel to provide two branches within the respective cooling zone, the branches bifurcating and re-joining within the respective cooling zone.

10. An assembly according to claim 1, wherein at least one geometric parameter differs between the first and second cooling zones, selected from the group consisting of:
a hydraulic diameter of the flow channel;
a width or height of the flow channel;
a cross-sectional area of the flow channel;
a number of passes of the flow channel through the respective cooling zone; and
a characteristic dimension of a flow acceleration protrusion configured to locally accelerate the cooling flow.

11. An assembly according to claim 1, wherein the power device is configured to operate in a first operation mode in which a heat generation rate of the first power switching component is greater than a heat generation rate of the second power switching component.

12. An assembly according to claim 1, wherein the power device is configured to operate in a first operation mode in which both the first and second switching components generate heat, and such that:
the peak or average heat transfer coefficient is greater in the first cooling zone is greater than in the second cooling zone;
a heat transfer rate between the power device and the cooling plate is greater in the first cooling zone than in the second cooling zone.

13. An assembly according to claim 1, further comprising:
a pump configured to provide a cooling flow to the flow channel in use;
a sensor configured to monitor a temperature of the first power switching component; and
a controller configured to control an operation of the pump based on an output of the sensor to maintain a temperature of the first power switching component within a target temperature range.

14. An assembly according to claim 1, wherein the geometric parameter which differs is configured to provide a greater peak or average heat transfer coefficient in the first cooling zone than in the second cooling zone.

15. An assembly according to claim 1, wherein
in each cooling zone, the flow channel has a normalised wetted area defined as a ratio of a wetted area of the flow channel within the cooling zone to an area of the power switching component overlying the cooling zone; and
the geometric parameter which differs is configured to provide a greater normalised wetted area in the first cooling zone than in the second cooling zone.

16. An assembly according to claim 1, wherein
when in the first operation mode, each cooling zone has a normalised heat transfer rate corresponding to a ratio of a local heat transfer rate between the cooling plate and a cooling flow to a temperature difference therebetween; and
the geometric parameter which differs such that there is a greater normalised heat transfer rate in the first cooling zone than in the second cooling zone.

17. A method for cooling a plurality of power switching components in an assembly comprising a power device and a cooling plate overlying the power device for heat transfer therebetween;
wherein the power device comprises the plurality of power switching components including at least a first power switching component and a second power switching component; wherein each of the power switching components is configured to dissipate heat to the cooling plate:
wherein the cooling plate comprises:
a plurality of cooling zones overlying and aligned with the respective power switching components for heat transfer, including first and second cooling zones corresponding to the first and second power switching components; and
a flow channel for a cooling flow, extending between an inlet and an outlet through each of the cooling zones;
wherein a geometric parameter of the flow channel that at least partly determines heat transfer in a respective cooling zone differs between the first and second cooling zones for improved heat transfer in the first cooling zone relative to the second cooling zone,
wherein in the first cooling zone, there is a flow acceleration protrusion defined by the cooling plate, the flow acceleration protrusion extending into the flow channel configured to locally accelerate the cooling flow by locally reducing the hydraulic diameter, and
wherein the or each flow acceleration protrusion is fastened to or configured to fasten to a respective power switching component, so that the respective power switching component is fastened to the cooling plate;
wherein the method comprises:
operating the power device so that at least some of the power switching components including the first and second power switching components generate heat;
providing a cooling flow to the flow channel using a pump;
cooling the first power switching component by providing the cooling flow to the first cooling zone for heat exchange with the first power switching device; and
cooling the second power switching component by providing the cooling flow to the second cooling zone for heat exchange with the second power switching component;
wherein a heat transfer rate from the power device to the cooling plate is greater in the first cooling zone than in the second cooling zone.

18. A method according to claim 17, further comprising:
monitoring a temperature of the first power switching device using a temperature sensor;
controlling an operation of the pump based on a signal from the temperature sensor to maintain a temperature of the first power switching component within a target range.

* * * * *